US012744301B2

(12) United States Patent
Dzurak et al.

(10) Patent No.: US 12,744,301 B2
(45) Date of Patent: Sep. 22, 2026

(54) GLOBAL CONTROL FOR QUANTUM COMPUTING SYSTEMS

(71) Applicant: DIRAQ PTY LTD, NSW Elizabeth Bay (AU)

(72) Inventors: Andrew Dzurak, UNSW Sydney (AU); Jarryd James Pla, UNSW Sydney (AU)

(73) Assignee: DIRAQ PTY LTD, NSW Elizabeth Bay (AU)

(*) Notice: Subject to any disclaimer, the term of this patent is extended or adjusted under 35 U.S.C. 154(b) by 1106 days.

(21) Appl. No.: 17/776,929

(22) PCT Filed: Nov. 16, 2020

(86) PCT No.: PCT/AU2020/051239
§ 371 (c)(1),
(2) Date: May 13, 2022

(87) PCT Pub. No.: WO2021/092661
PCT Pub. Date: May 20, 2021

(65) Prior Publication Data

US 2022/0407213 A1 Dec. 22, 2022

(30) Foreign Application Priority Data

Nov. 15, 2019 (AU) ................................ 2019904308

(51) Int. Cl.
*H01P 7/10* (2006.01)
*C04B 35/47* (2006.01)
(Continued)

(52) U.S. Cl.
CPC ................ *H01P 7/10* (2013.01); *C04B 35/47* (2013.01); *G06N 10/40* (2022.01); (Continued)

(58) Field of Classification Search
CPC ...... H01P 7/10; G06N 10/40; H10D 48/3835; H10D 48/385; H10D 62/814; H10D 48/383; C04B 35/47; H01F 10/1933
See application file for complete search history.

(56) References Cited

U.S. PATENT DOCUMENTS 11,879,789 B2 * 1/2024 Olivadese ............ G06F 30/367
2017/0276743 A1 9/2017 Liu et al.
(Continued)

FOREIGN PATENT DOCUMENTS

WO 2015184484 A1 12/2015
WO 2017089891 A1 6/2017
WO 2018051099 A1 3/2018

OTHER PUBLICATIONS

T. Yasukawa et al, "Addressing spin transitions on 209Bi donors in silicon using circularly polarized microwaves" Mar. 25, 2016, American Physical Society, pp. 121306-1-121306-5 (Year: 2016).*
(Continued)

*Primary Examiner* — David Vu
*Assistant Examiner* — Brandon C Fox
(74) *Attorney, Agent, or Firm* — Polsinelli PC

(57) ABSTRACT

Systems and methods for controlling one or more qubits in a quantum processor are disclosed. The system comprises a quantum processor comprising one or more spin-based qubits; and a dielectric resonator positioned in proximity to the quantum processor. The dielectric resonator provides a magnetic field. The quantum processor is positioned in a portion of the magnetic field provided by the resonator such that the portion of the magnetic field controls the spin transitions of the one or more spin-based qubits of the quantum processor.

21 Claims, 13 Drawing Sheets

(51) Int. Cl.

| | |
|---|---|
| ***G06N 10/40*** | (2022.01) |
| ***H10D 48/00*** | (2025.01) |
| ***H10D 62/81*** | (2025.01) |
| ***H10N 60/10*** | (2023.01) |

(52) U.S. Cl.

CPC ....... *H10D 48/383* (2025.01); *H10D 48/3835* (2025.01); *H10D 48/385* (2025.01); *H10D 62/814* (2025.01); *H10N 60/11* (2023.02); *H10N 60/128* (2023.02)

(56) References Cited

U.S. PATENT DOCUMENTS

| | | | |
|---|---|---|---|
| 2018/0107938 A1 | 4/2018 | Morello et al. | |
| 2019/0074557 A1 | 3/2019 | Shin et al. | |
| 2019/0074570 A1 | 3/2019 | Friedman | |
| 2020/0167683 A1* | 5/2020 | Frisch ................ | H05K 7/20372 |
| 2022/0199888 A1* | 6/2022 | Daraeizadeh .......... | G06N 10/40 |

OTHER PUBLICATIONS

Extended European Search Report for EP Application No. 20888404.9, mailed Nov. 23, 2023, 15 pages.

Yasukawa T. et al., “Addressing spin transitions on 209Bi donors in silicon using circularly-polarized microwaves”, arXiv:1601.05735v2 [quant-ph], Jan. 22, 2016. DOI: 10.1103/PhysRevB.93.121306.

Geyer R. G. et al., “Microwave dielectric properties of single-crystal quantum paraelectrics KTaO3 and SrTiO3 at cryogenic temperatures”, Journal of Applied Physics 97, 104111, 2005.

Ball J. et al., “Loop-gap Microwave Resonator for Hybrid Quantum Systems”, arXiv:1802.04485 [quant-ph]. DOI: 10.1063/1.5025744.

Stoekklauser A. et al., “Strong Coupling Cavity QED with Gate-Defined Double Quantum Dots Enabled by a High Impedance Resonator”, Physucak Review X 7, 011030 (2017).

Park D.K. et al., “Randomized benchmarking of quantum gates implemented by electron spin resonance”, arXiv:1510.04779 [quant-ph]. DOI: 10.1016/j.jmr.2016.04.010.

Colton J.S. and Wienkes L.R., “Resonant microwave cavity for 8.5-12 GHz optically detected electron spin resonance with simultaneous nuclear magnetic resonance”, Review of Scientific Instrucments, 80, 035106 2009. https://doi.org/10.1063/1.3095683.

International Search Report and Written Opinion for International application No. PCT/AU2020/051239, mailed Dec. 15, 2020, 6 pages.

Singapore Search Report and Written Opinion for Application No. 11202205083P, dated Jan. 23, 2026, 9 pages.

* cited by examiner

GLOBAL CONTROL FOR QUANTUM COMPUTING SYSTEMS

TECHNICAL FIELD

Aspects of the present disclosure are related to methods and systems for controlling quantum bits in a quantum computing system.

BACKGROUND

Quantum computers and quantum simulators are poised to revolutionise many aspects of our modern society, from fundamental science and medical research to national security. The implications to defence of many of these applications, such as finding prime factors or encryption breaking, designing new materials from first-principles, artificial intelligence and machine learning will be considerable. Whilst a few applications are expected to be executable on medium-scale quantum computers (with 100-1000 qubits) that do not employ error correction protocols, some of the most disruptive algorithms, for example Shor's algorithm for prime factoring, will require a large-scale and fully fault-tolerant quantum computer with upwards of a million qubits.

However, before such large-scale quantum computers can be manufactured commercially, a number of hurdles need to be overcome. One such hurdle is control of qubits (the basic unit of quantum information control). To date, several techniques have been proposed to control the states of qubits, but these techniques either cannot be effectively scaled-up or result in faster decoherence.

Accordingly, there exists a need for a scalable qubit control system that can simultaneously control multiple qubits while not adversely affecting the operation of the qubits.

SUMMARY

In accordance with a first aspect, the present invention provides a system for controlling one or more qubits in a quantum processor, the system comprising: a quantum processor comprising one or more spin-based qubits; and a dielectric resonator positioned in proximity to the quantum processor, the dielectric resonator providing a magnetic field, and the quantum processor being positioned in a portion of the magnetic field provided by the dielectric resonator such that the portion of the magnetic field controls the spin transitions of the one or more spin-based qubits of the quantum processor.

In an embodiment, the multiple spin-based qubits of the quantum processor are operated and controlled by the portion of the magnetic field provided by the dielectric resonator at a cryogenic temperature.

In some embodiments, the cryogenic temperature is less than or equal to 4 Kelvin.

In a further embodiment, the dielectric resonator is made of a dielectric material having a dielectric constant that increases at the cryogenic temperature relative to at room temperature.

In some embodiments, the dielectric constant of the resonator is in a range of 1000 to 40,000 at the cryogenic temperature.

In some embodiments, the portion of the magnetic field controlling the one or more spin-based qubits is a uniform AC magnetic field.

In some embodiments, the portion of the magnetic field acts as a global magnetic field for simultaneously controlling a plurality of spin-based qubits of the quantum processor.

In some embodiments, the dielectric resonator produces an electric field spatially separated from the magnetic field.

In some embodiments, the magnetic field of the dielectric resonator is perpendicular to a surface of the resonator.

In some embodiments, the electric field is confined away from the position of the quantum processor for minimising the interaction of the electric field with the one or more spin-based qubits, and on-chip measurement and control electronics of the quantum processor.

In some embodiments, the electric field circulates within the resonator.

In some embodiments, the dielectric resonator is made of a material from a class of compounds having a perovskite structure ($^{XII}A^{2+\,VI}B^{4+}X^{2-}{}_3$).

In some embodiments, the dielectric resonator is made of potassium tantalate ($KTaO_3$) or strontium titanate ($SrTiO_3$).

In some embodiments, the dielectric resonator provides a resonant mode volume of approximately 5×10-7 $m^3$.

In some embodiments, the quantum processor is a solid-state semiconducting or superconducting quantum processor.

In some embodiments, the dielectric resonator is in the form of a solid block of a dielectric material and the quantum processor is placed either above or below the dielectric resonator such that the one or more spin-based qubits of the quantum processor faces towards the dielectric resonator to interact with the portion of the AC magnetic field provided by the dielectric resonator.

In some embodiments, the system further comprises a tuneable coupling element to provide a microwave input signal to the dielectric resonator for generating the magnetic field. The dielectric resonator may require a low power of the microwave input signal that minimises any effects on the cryogenic environment of the quantum processor.

In some embodiments, the resonator has a quality factor Q having a value greater than 100 at cryogenic temperatures.

In some embodiments, the frequency of the magnetic field produced by the resonator is in radio frequency range from 1.0 MHz to 1.0 GHz for controlling nuclear spins.

In some embodiments, the frequency of the magnetic field produced by the resonator is in microwave frequency range, which is in a range of 1.0 GHz to 100.0 GHz for controlling electron spins.

In accordance with a second aspect, the present invention provides a method for controlling one or more spin-based qubits in a quantum processor using the system described in the first aspect of the invention.

As used herein, except where the context requires otherwise, the term "comprise" and variations of the term, such as "comprising", "comprises" and "comprised", are not intended to exclude further additives, components, integers or steps.

Further aspects of the present invention and further embodiments of the aspects described in the preceding paragraphs will become apparent from the following description, given by way of example and with reference to the accompanying drawings.

DETAILED DESCRIPTION

Overview

This section describes an overview of prior art quantum computing systems and various problems associated with qubit control techniques implemented in these systems.

One type of quantum computing system is based on spin states of individual qubits where the qubits are electron and nuclear spins localised inside a silicon quantum chip. These electron and nuclear spins are either confined in man-made quantum dots (e.g. FIG. 2) or on naturally occurring donor atoms (e.g. FIG. 1) that are implanted in the quantum chip.

Early breakthrough qubit experiments undertaken by the Applicant have demonstrated the great promise of these quantum systems, where key figures of merit including qubit coherence times, control, and measurement fidelities outperform most of the other type of quantum computing systems. In these small-scale systems (e.g., those shown in FIGS. 1 and 2), on-chip transmission lines are used for local control of each individual qubit. In particular, each individual qubit is provided with a dedicated on-chip transmission line situated a few hundred nanometres away from the position of the qubit.

Figure 1:
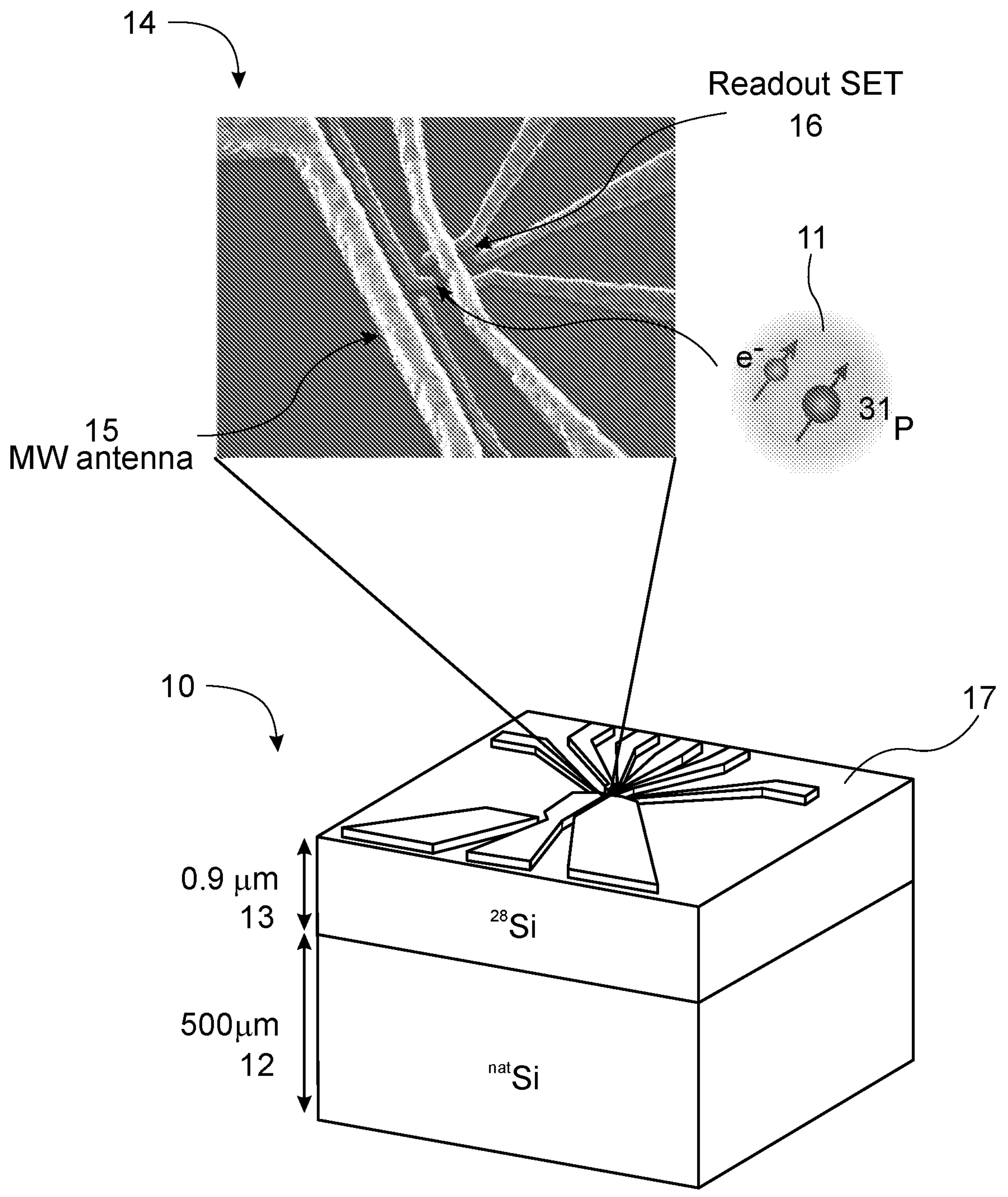
FIG. 1 shows a prior art quantum-computing device having a donor-based qubit controlled by a local on-chip transmission line.

FIG. 1 shows an example of a small-scale silicon quantum chip 10 having a single donor-based qubit. As shown in this figure, the quantum chip 10 has a first layer 12 of a silicon substrate and a second layer 13 of a silicon-28 isotope ($^{28}Si$) which is a purified form of silicon. The first layer 12 has a thickness of approximately 500 micrometres and the second layer 13 has a thickness of approximately 0.9 micrometres. A window 14 shows a zoomed-in view of a central portion of an upper surface 17 of the quantum chip 10. A qubit 11 is situated roughly at the centre of the upper surface 17. The qubit 11 comprises an electron spin and a nuclear spin. The nuclear spin may be of a Phosphorous-31 ($^{31}P$) donor atom. There is an on-chip transmission line 15 for controlling the qubit 11. The on-chip transmission line 15 is situated only a few hundred nanometres away from the qubit 11 to deliver a strong magnetic microwave signal B (also known as electron Spin Resonance signal or ESR signal) and an RF signal (also known as Nuclear Magnetic Resonance signal or NMR signal) for controlling the electron and nuclear spins of the qubit 11. The ESR signal may have a frequency of approximately 40 GHz and the NMR signal may have a frequency of approximately 100 MHz. A single electron transistor (SET) 16 is used as a charge sensor to readout the state of the qubit 11. As evident from this figure, the SET sensor 16 is located in close proximity of the on-chip transmission line 15 and the qubit 11.

Figure 2:
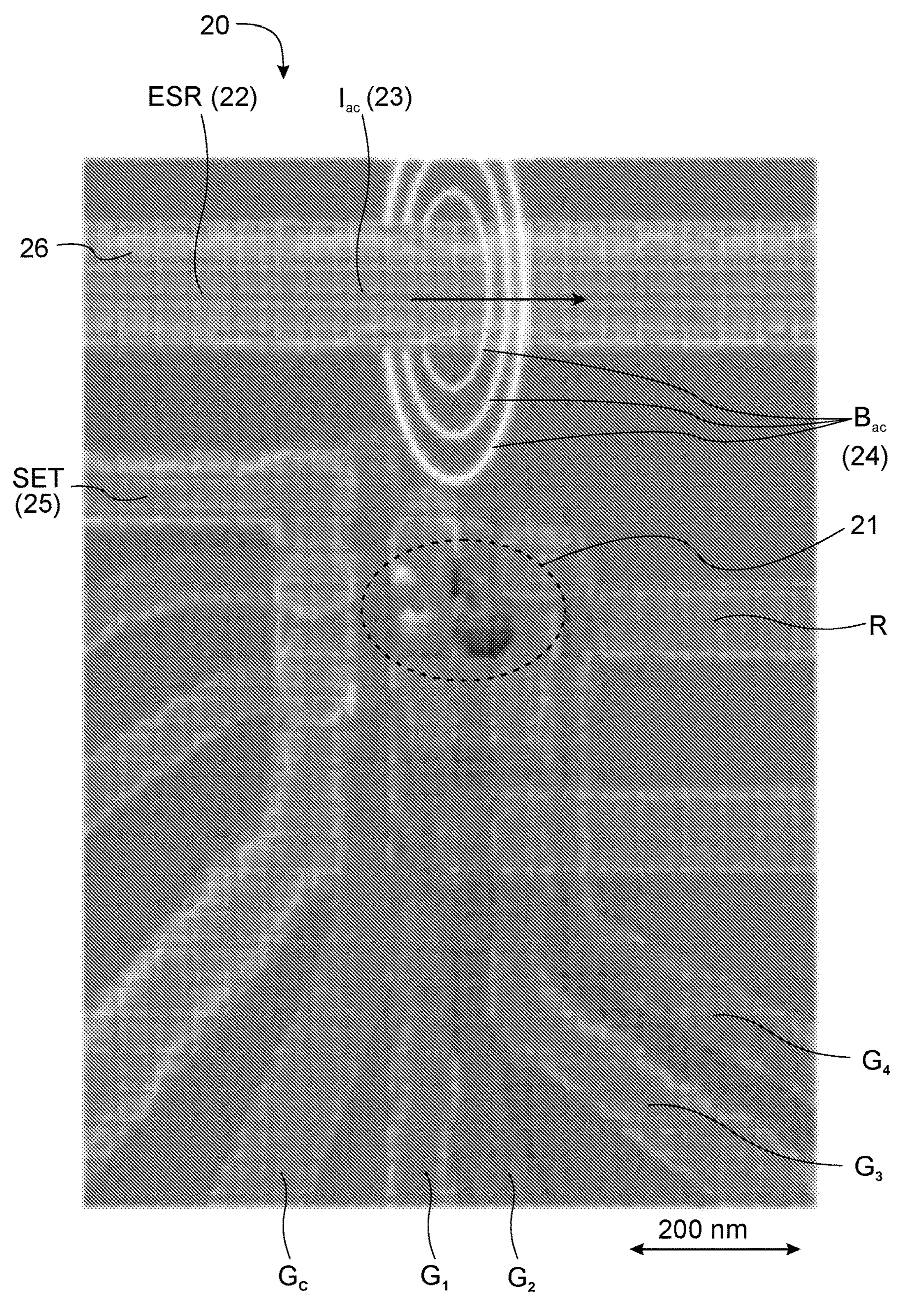
FIG. 2 shows a prior art quantum-computing device having a quantum dot qubit controlled by a local on-chip transmission line.

FIG. 2 shows a plan view of a quantum computing chip 20 having a single qubit 21 confined in an artificially formed quantum dot. This system is different from the system of FIG. 1 in that the qubit 21 is localised in a silicon quantum dot rather than in a naturally occurring donor atom like $^{31}P$. However, similar to the quantum chip of FIG. 1, the quantum chip 20 of FIG. 2 uses a dedicated on-chip transmission line 26 for locally controlling the qubit 21. The on-chip transmission line 26 provides an ESR signal and an RF signal (not shown in FIG. 2). The ESR signal produces microwave magnetic field lines B as shown by reference numeral 24 to control the qubit 21. Further, the quantum chip 20 includes one or more SET sensors 25 for measuring the quantum state of the qubit 21. As evident from FIG. 2, the SET sensor 25 is located in close proximity of the on-chip transmission line 26 and the qubit 21.

In the systems illustrated in FIGS. 1 and 2, a qubit can coherently operate in a microwave magnetic field that is generated "locally" using an on-chip transmission line (e.g., transmission line 15 or 26). In these systems, the local microwave magnetic field B is operated in a "pulsed mode", i.e., it is switched on when a qubit rotation is required. The reason for operating the local microwave magnetic field B in a pulsed mode is that the transmission line (15 or 26) generates strong AC electric fields, which interfere with the SET operation. Therefore, the microwave field is typically turned off at least before the qubit measurement.

The above-described localised control of qubits (i.e., a dedicated transmission line per qubit) has been successfully implemented in small-scale quantum computers. However, there may be some complications and/or drawbacks associated with the local control signals produced by these local transmission lines.

First, impedance mismatching in a transmission line (e.g., transmission line 15 or 26) can generate spurious electric fields that can interfere with the sensitive SETs used for measuring the quantum states of the qubits, rendering them unusable whilst the control ESR and NMR signals are applied by the transmission line. As evident from FIGS. 1 and 2, SETs are located in close proximity (e.g., in nanometer range) from the transmission lines and any spurious electric fields generated by these transmission lines can affect operation of the adjacent SETs.

Second, Joule heating from microwave current (produced by control ESR signal) induced in the transmission line and currents induced elsewhere in the quantum chip raises the chip temperature. This severely impacts qubit state measurement and initialisation fidelities.

Third, it was found that more than 100 nW of heat is dissipated in the quantum chip per qubit control transmission line. Quantum systems are very susceptible to thermal noise, and therefore are typically operated at very low temperatures (in the order of tens to hundreds of milli kelvin). Dilution refrigerators are used to bring the systems down to these temperatures, however these dilution refrigerators provide a finite amount of cooling power. For example, some dilution refrigerators have a cooling power of 15 μW at 20 mK. Considering that 100 nW of heat is dissipated per qubit, it is difficult to scale up the number of qubits in the quantum chip with the currently available refrigeration capabilities, which is at the limit of what a typical dilution refrigerator can handle whilst maintaining a temperature of 20 mK. Larger cooling powers of 200-300 μW are available at higher temperatures (approximately 100 mK), however, the number of allowable qubits is still fundamentally limited. For example, for 100 qubits, 10 μW of heat will be dissipated, which is at the limit of what a typical dilution refrigerator can handle.

The above-mentioned problems of localised control fields become unmanageable when local transmission lines are implemented in a medium or large-scale quantum computer. First, it is very complicated to implement one transmission line per qubit in a quantum chip comprising hundreds, thousands or even millions of qubits. Even if a successful implementation of one transmission line per qubit is achieved in a multi-qubit quantum chip, the amount of joule's heating produced by the transmission lines will likely destroy the cryogenic environment (temperatures equal to or less than 4K) that is essential for the operation of quantum chips. Further, the electric fields produced by impedance mismatching in multiple transmission lines would be extremely large and will likely adversely affect the operations of sensitive SETs. Further still, in such an arrangement, the transmission lines will occupy a large proportion of chip real-estate. For example, the size of a single transmission line can scale from nanometer sizes to hundreds of micrometers. This is a significant amount of space for a quantum processor with atomic-sized qubits, which can seriously complicate architecture design of a quantum chip for a medium or large-scale quantum computer.

Due to the above-described problems, it is accepted in the quantum-computing field that localised control of qubits using one transmission line per qubit may not be a viable solution for scaling to medium or large-scale quantum computers. Therefore, new models of quantum chip architectures for both quantum dot-based quantum computers and donor-based spin quantum computers propose implementation of a "global" control of multiple qubits for scalable quantum computers.

Figure 3:
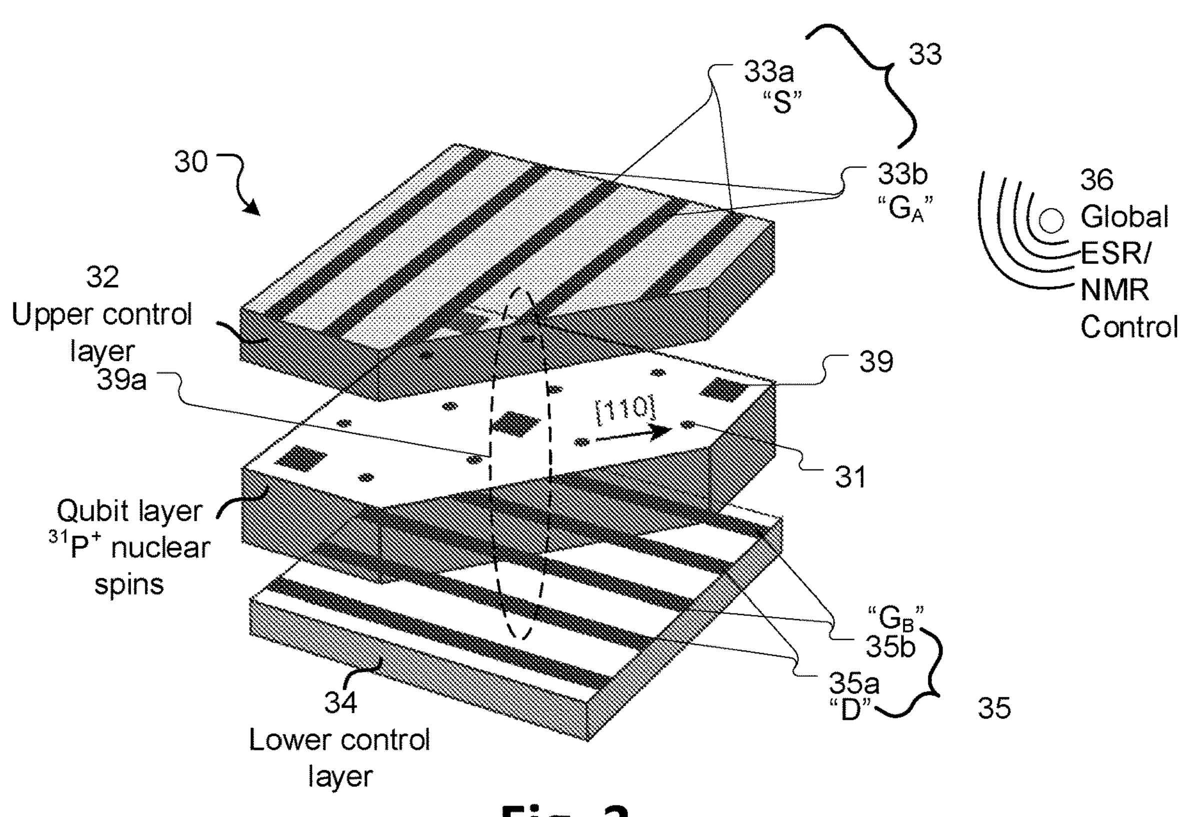
FIG. 3 shows a schematic architecture of a prior art scalable donor-based quantum computer that employs global control of qubits.

For example, FIG. 3 shows an exploded schematic architecture of a known scalable silicon quantum computing structure 30. This structure is formed in an isotopically purified silicon 28 ($^{28}$Si) substrate. In particular, a plurality of donor atoms 31 are embedded in the silicon lattice. Two sets of control lines extend across the architecture. Control lines are disposed on an upper control layer 32 above the qubit layer and control lines are disposed on a lower control layer 34 below the qubit layer. The control lines 33 and 35 are arranged perpendicularly, with respect to each other, in a crisscross configuration. The control lines in the two planes do not physically intersect, however they define intersection points **39*a* where they pass across two vertically aligned portions of the lattice. About some of these intersections, control elements 39**, provided in the form of a heavily doped silicon island, are formed. Each island forms a single electron transistor (SET) with respective control members disposed above and below the island. A pair of these control members acts as source and drain of the transistor, and another pair act as transistor gates.

In structure 30 the control lines 35 on the bottom plane are separated in two interleaved groups **35*a* and 35*b*. Control lines 35*a* act as drains (D) of the SETs and control lines 35*b* act as gates (GB) of the SETs 39. A similar configuration is shown for the control lines on the top plane (e.g., control lines 33*a* and 33*b*), which act respectively as sources (S) and gates (GA) of the SETs 39. Each SET 39 interacts with one or more donor atoms 31 through the respective control island 39*a***.

This quantum computing structure 30 has a donor-based silicon quantum chip 30 that employs a global control of multiple qubits simultaneously. In this system, global microwave (MW) and radio frequency (RF) control signals 36 are in an "always on" state whereas suitable electrical signals are applied to the individual qubits whenever the qubits are required to be rotated/controlled by the "always-on" global control signals.

Global control is implemented in this system by generating "global" microwave (MW) and radiofrequency (RF) control fields 36 that are present across the entire quantum chip 30. During operation, the entire system 30 is cooled to milli-Kelvin temperature range. Pulses applied to the control lines 33 and 35 can then drive transitions between qubit logic states.

In one approach, these MW and RF control fields 36 can be generated by embedding the silicon quantum chip 30 in a three-dimensional (3D) microwave resonator (of frequency ω and quality factor Q) where the resonator is typically constructed from copper or some other high-conductivity metal and probed with a series of microwave pulses.

However, this arrangement suffers from several issues. For instance, the high conductivity of the metal gates and bond wires on the chip 30 can adversely affect important characteristics such as resonant frequency ω and quality factor Q of the microwave resonator. Furthermore, these microwave resonators typically generate large AC electric fields within the cavity, which can interfere with and potentially damage the sensitive SET sensor devices 39 on the chip 300 thereby significantly affecting the desired operation and detection of the qubit states of the quantum processor.

An important metric for any microwave resonator used in spin resonance applications is the power-to-field conversion factor C, which quantifies how well a microwave input signal is converted to the AC magnetic field needed to drive spin rotations. The relation $B_1 = C\sqrt{P}$ relates the magnetic field $B_1$ accumulated inside the microwave resonator to the input microwave signal power P and the conversion factor C. For qubits rotations in a quantum processor/chip, a high magnetic MW field is required, which means either C or P or both have to be reasonably high to produce a workable MW magnetic field $B_1$ inside the microwave resonator.

The inventors of the present application have understood that conventional metallic/copper microwave cavities have low conversion factors C. Therefore, according to the relation $B_1 = C\sqrt{P}$, if a quantum chip were to be placed inside a traditional metallic/copper microwave resonator, a substantially high power P of the input microwave signal would be required (since the conversion factor C of these cavities is very low) to drive sufficiently fast spin rotations of the qubits. However, such high powers of the input microwave signal would be incompatible with the cryogenic environment in which the quantum chip/processor can exist and operate.

The inventors have therefore concluded that the conventional metallic/copper microwave cavities cannot suitably provide global control signals to qubits of a quantum chip/processor.

Figure 4:
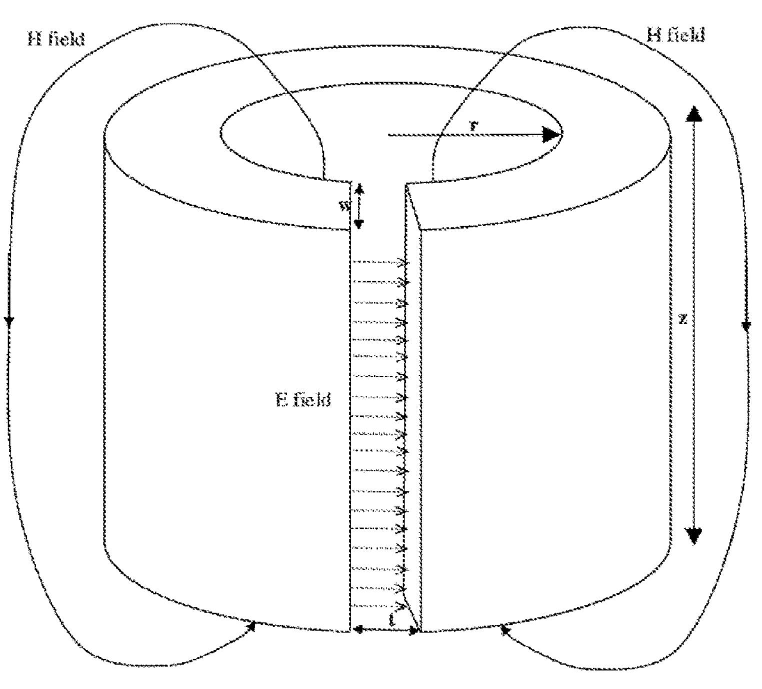
FIG. 4 shows a prior art a loop-gap resonator capable of separating out magnetic and electric fields, and direct them in different regions.

There has been one other experimental technique for providing global control. This technique employs a loop-gap resonator. As shown in FIG. 4, the loop-gap-resonator 40 has an internal radius r, a length z, a wall thickness of w, and a capacitive gap of separation t extending along the length of the resonator 40. This loop-gap-resonator is designed to provide a spatial separation between the electric field component (E) and magnetic field component (H) of the resonant mode. Ideally, the resonator 40 is supposed to confine the electric field component between the capacitive gap and allow the magnetic field component to circulate in loops from the upper cross-section to the lower cross-section of the resonator 40.

This resonator 40 has exhibited a conversion factor of $C \approx 0.03\ mT/\sqrt{(mW)}$, and a quality factor of $Q \approx 200$. This means a relatively low power of input MW signal, for example P=10 mW, (which is low in comparison to the relatively high powers required for traditional microwave resonators, but still high in comparison to the cooling power of a typical dilution refrigerator) can be used to generate a MW magnetic control signal that is capable of providing a requisite qubit rotation/control.

When a qubit is placed within the magnetic field component of the loop-gap resonator 40, it is only affected by the magnetic field component H and does not see the electric field component E, which is confined within the capacitive gap. Therefore, the separation of the electric and magnetic field components provided by this loop-gap resonator reduces the adverse effects of the resonator on the qubit (and especially the SET devices) and vice-versa.

However, actual experimental results show that even at a considerably lower power (e.g., 0.5 mW which is not even sufficient to provide requisite qubit control) there is a high residual stray electric field inside the resonator 40. This stray electric field is sufficient to overwhelm the SET device sensors of the quantum chip and therefore adversely affect the qubit spin measurement.

Furthermore, although the resonator 40 requires a lower input power MW signal than required by traditional resonators, at least an input power of approximately 10 mW would be needed to achieve a sufficient qubit control frequency (2-3 MHz). This power is at least three-orders-of-magnitude too high to allow for continuous operation of the quantum chip in the milli-Kelvin temperature range. Further, this input power range heats up a quantum chip and interferes with its normal operation. Therefore, even the loop-gap resonator cannot successfully demonstrate global control.

Accordingly, implementation of global control signals for controlling multiple qubits in a quantum chip without disrupting the environment in which qubits can operate to perform quantum computing has not been successfully implemented. Put another way, for medium and larger-scale quantum computers, implementation of global control signals to collectively control multiple qubits without disrupting the delicate environment of the qubits in the quantum chip remains an outstanding challenge.

Some of the requirements of the quantum chip environment include, for example, maintaining the quantum chip at required cryogenic temperatures to ensure the expected function of the quantum chip. The cryogenic temperature requirement arises from the fact that quantum phenomenon in the quantum chip/processor occurs only at very low temperatures. Higher temperatures can easily alter certain properties (e.g. resonant frequencies, coherence times etc.) of the qubits and their quantum behaviour altogether. Typically, cryogenic constraints require the operation of the quantum chip/processor at a temperature in the range of 1 mK-4K. The other requirement includes preventing any stray electric fields or electric fields generated by control signals from affecting the SET sensors and qubits. As already discussed, microwave resonators can provide global control fields however these pose multiple problems when integrated with quantum chips/processors.

Resonator for Global Control

The inventors of this application realised that in order to produce such global control fields, a microwave resonator is required which can provide a sufficiently high MW magnetic control field for effectively controlling/rotating the qubits and which, at the same time, does not breakdown the fragile environment in which quantum chips/processors operate.

The present disclosure discloses one such resonator. In particular, the resonator disclosed herein is a high dielectric constant, solid state, microwave resonator, which can be placed in proximity to a spin-based quantum chip/processor to direct the required magnetic field to control qubits on the quantum chip.

In certain embodiments, the resonator is formed of a dielectric medium and in particular of a quantum paraelectric medium. In an embodiment, the quantum para-electric medium has a perovskite structure (${}^{XII}A^{2+}{}^{VI}B^{4+}X^{2-}{}_{3}$). In a particular embodiment, the quantum paraelectric medium is potassium tantalate ($KTaO_3$) or strontium titanate ($SrTiO_3$). Quantum paraelectric mediums exhibit extraordinarily large dielectric constants at cryogenic temperatures. For example, potassium tantalate exhibits a dialectic constant of $\varepsilon_r \approx 4{,}300$ and strontium titanate exhibits a dielectric constant of $\varepsilon_r \approx 26{,}000$. This large dielectric constant $\varepsilon_r$ provides a very tight confinement of the electric field inside the dielectric resonator allowing for a well-defined spatial separation of the electric and magnetic field components. Further, the resonant frequency of a dielectric resonator is inversely proportional to the dielectric constant $\varepsilon_r$ of the material and its mode volume V, and is given by the following relation—

$$\omega \propto 1/\left(\varepsilon_r^{1/2} V^{1/3}\right)$$

Therefore, for a given frequency ω, the mode volume V of the resonator can be reduced by using these paraelectric materials that exhibit large $\varepsilon_r$ at cryogenic temperatures.

This class of materials also has very low microwave losses (for example, tan $\delta \sim 10^{-4}$ to $10^{-5}$ for $KTaO_3$) which allow for very high quality factors (Q~30,000 for $KTaO_3$).

Furthermore, this resonator has a very high conversion factor C to meet the high MW magnetic field requirements for controlling spins of the qubits (according to relation $B_1 = C\sqrt{P}$). The conversion factor C depends on the quality factor Q, frequency ω and mode volume V according to the relation $C \propto \sqrt{Q/\omega V}$. Typically, the frequency ω of operation is fixed by other experimental considerations. Therefore, in a typical embodiment, a high conversion factor C is achieved by providing a high quality factor Q or by providing low mode volume V or by providing a combination of a high quality factor Q and a low mode volume V. The properties of quantum para-electric mediums combine to produce large conversion efficiencies (for example, $C \approx 1$ mT/√(mW) for $KTaO_3$), which in itself is sufficient for continuous operation at milli-Kelvin temperatures. This conversion factor can be further improved by increasing the quality factor of the formed resonator.

In one example, a resonator formed according to aspects of the present disclosure can operate at a Rabi frequency of 3 MHz with an input power of 15 μW in the milli-Kelvin temperature range. The Rabi frequency is defined by the equation: $\Omega_R = \gamma_e B_1/2$ where $\gamma_e = 28$ GHz/T, is the gyromagnetic ratio of the electron spin and the division by two is to account for the rotating wave approximation. Because of this achievable conversion factor, the disclosed resonator does not overheat the quantum chip/processor placed adjacent to it.

Figure 5:
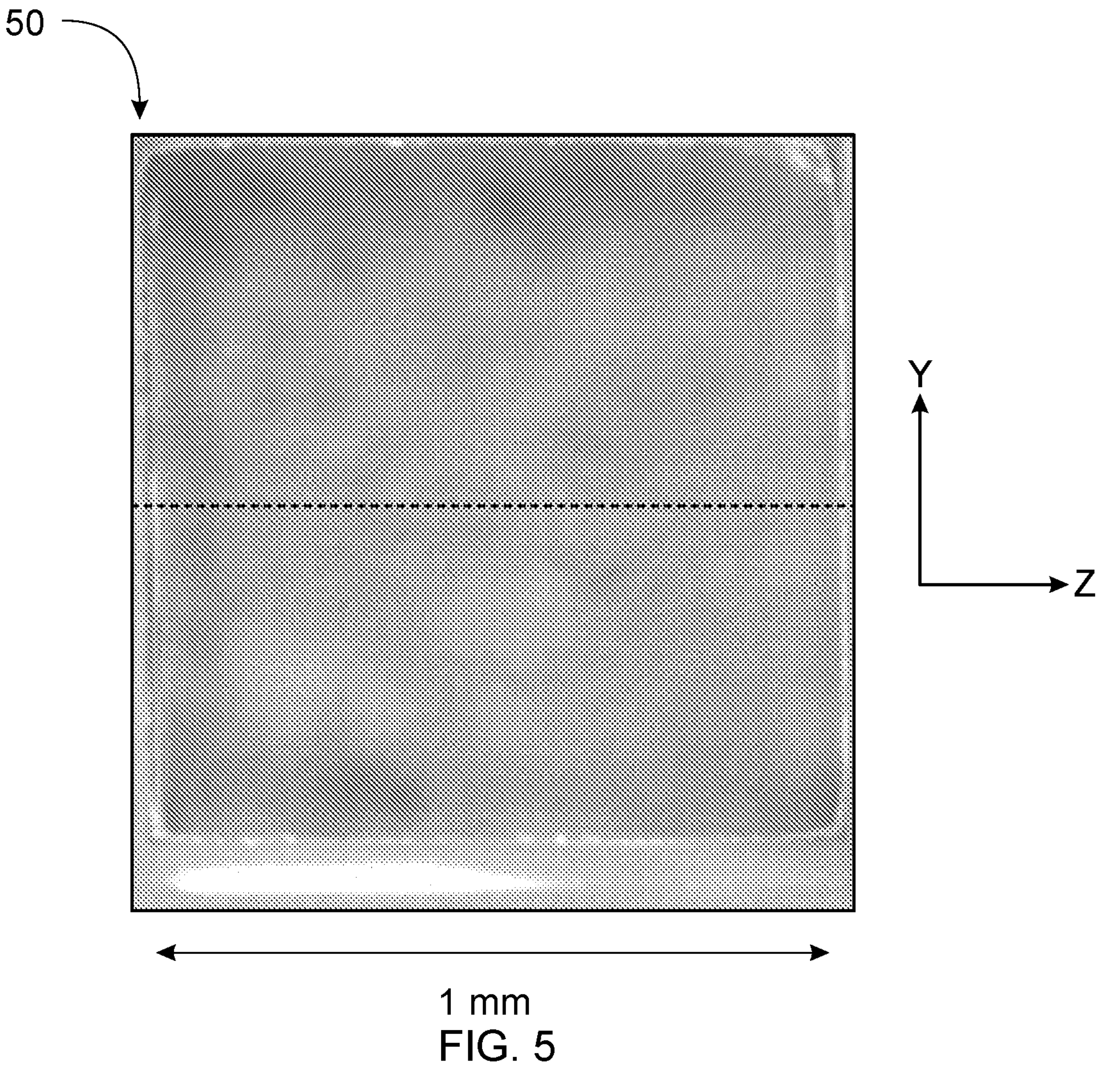
FIG. 5 shows a top view of a dielectric resonator made of Perovskite material (also known as potassium tantalate and has chemical formula of $KTaO_3$) and having a fundamental resonant frequency of 4.5 GHz, in accordance with an exemplary embodiment of the present disclosure.

FIG. 5 illustrates a plan view of an example solid-state dielectric resonator 50 according to embodiments of the present disclosure. In one example, the dimensions of the cuboid dielectric resonator may be 1 mm×1 mm×0.5 mm. Typically, there are 3 types of modes that appear in dielectric resonators—TE modes (electric field is transverse to the z-axis), TM modes (magnetic field is transverse to the z-axis) and hybrid modes (both electric and magnetic fields have components parallel to the z-axis). Cylindrical and annular resonators, typically exhibit all three modes.

The $TE_{11\delta}$ mode is particularly useful for performing ESR. The notation $TE_{11\delta}$ is used to denote that the resonator 50 radiates like a dipole in the z-axis and occurs when z is the smallest dimension. In this mode, the AC magnetic field generated by the resonator 50 is perpendicular to the surface 51 of the resonator 50 and extends outwardly (or inwardly) from the surface 51 of the resonator whereas the electric field component is in the transverse direction to the direction of the magnetic field component and is confined within the resonator 50.

Figure 6A:
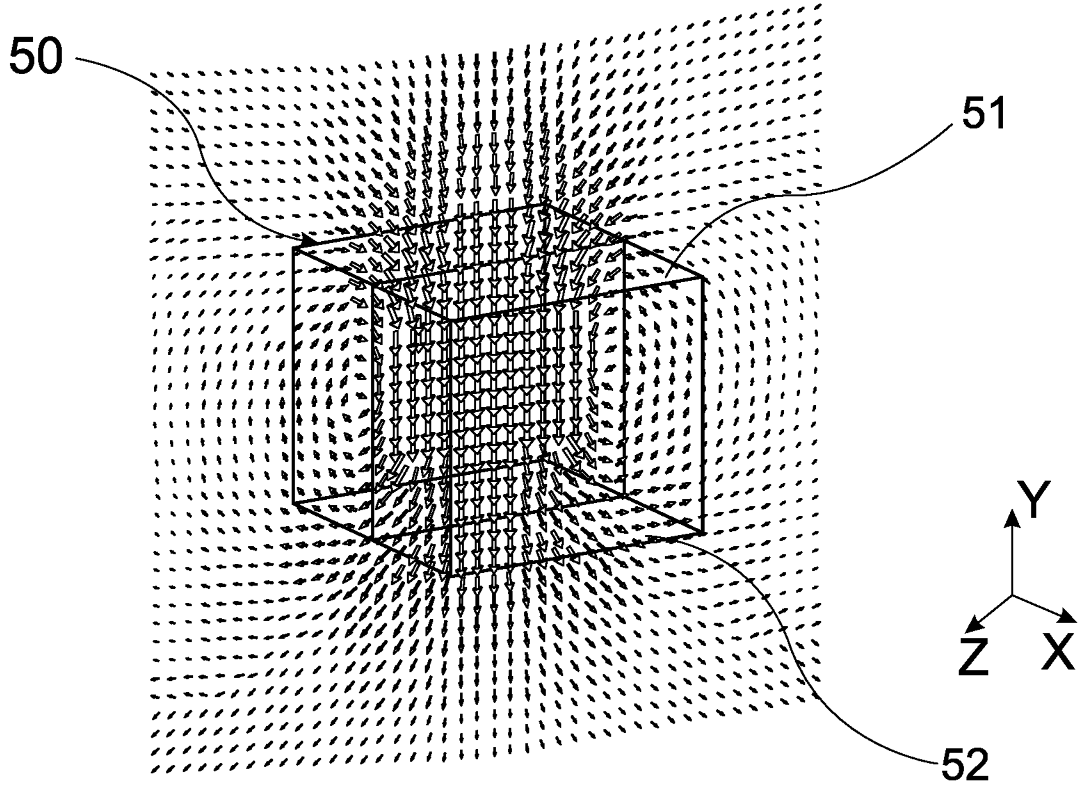
FIGS. 6*a* and 6*b* show magnetic and electric field profiles when $TE^{z111}$ mode (also referred to as $TE_{11\delta}$ in this disclosure) of the rectangular dielectric resonator of FIG. 5 is excited.
Figure 6B:
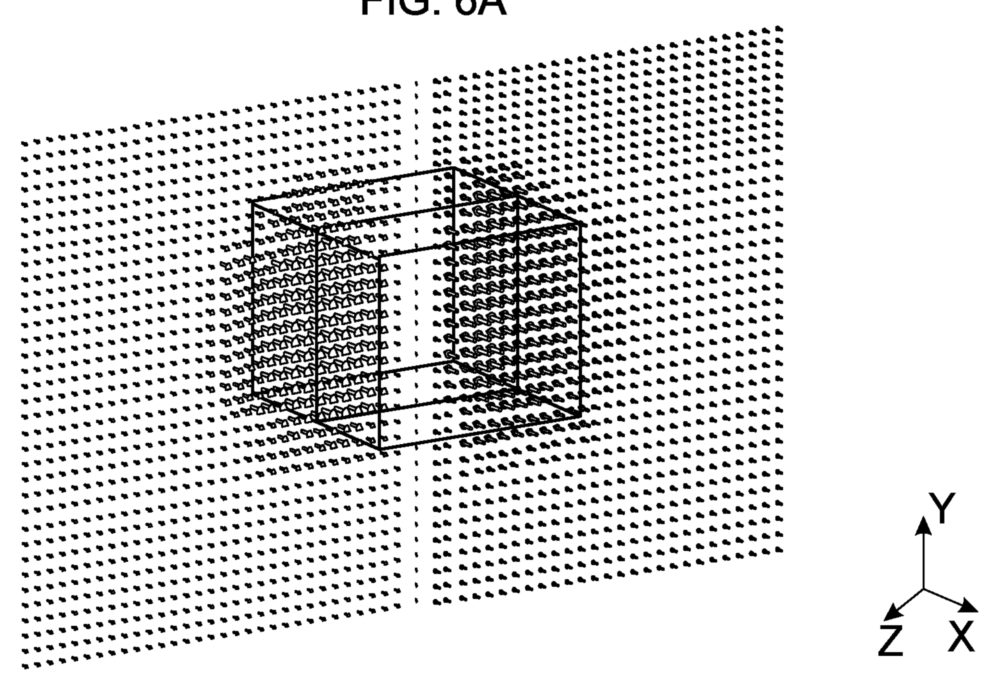

FIGS. 6(*a*) and 6(*b*) show perspective views of the dielectric resonator 50. In particular, FIG. 6(*a*) shows the magnetic field lines in the dielectric resonator 50 when the $TE_{11\delta}$ mode is excited and FIG. 6(*b*) shows the electric field lines in the dielectric resonator 50 when the $TE_{11\delta}$ mode is excited. As seen in FIG. 6A, the magnetic field component $B_1$ is perpendicular to surfaces 51 and 52 of the dielectric resonator 50. Similarly, from FIG. 6B, it is clear that the electric field component E of this resonator is almost completely confined and circulates inside the dielectric resonator 50.

Example Architecture for Global Control of Qubits

Figures 7, 8A, 8B:
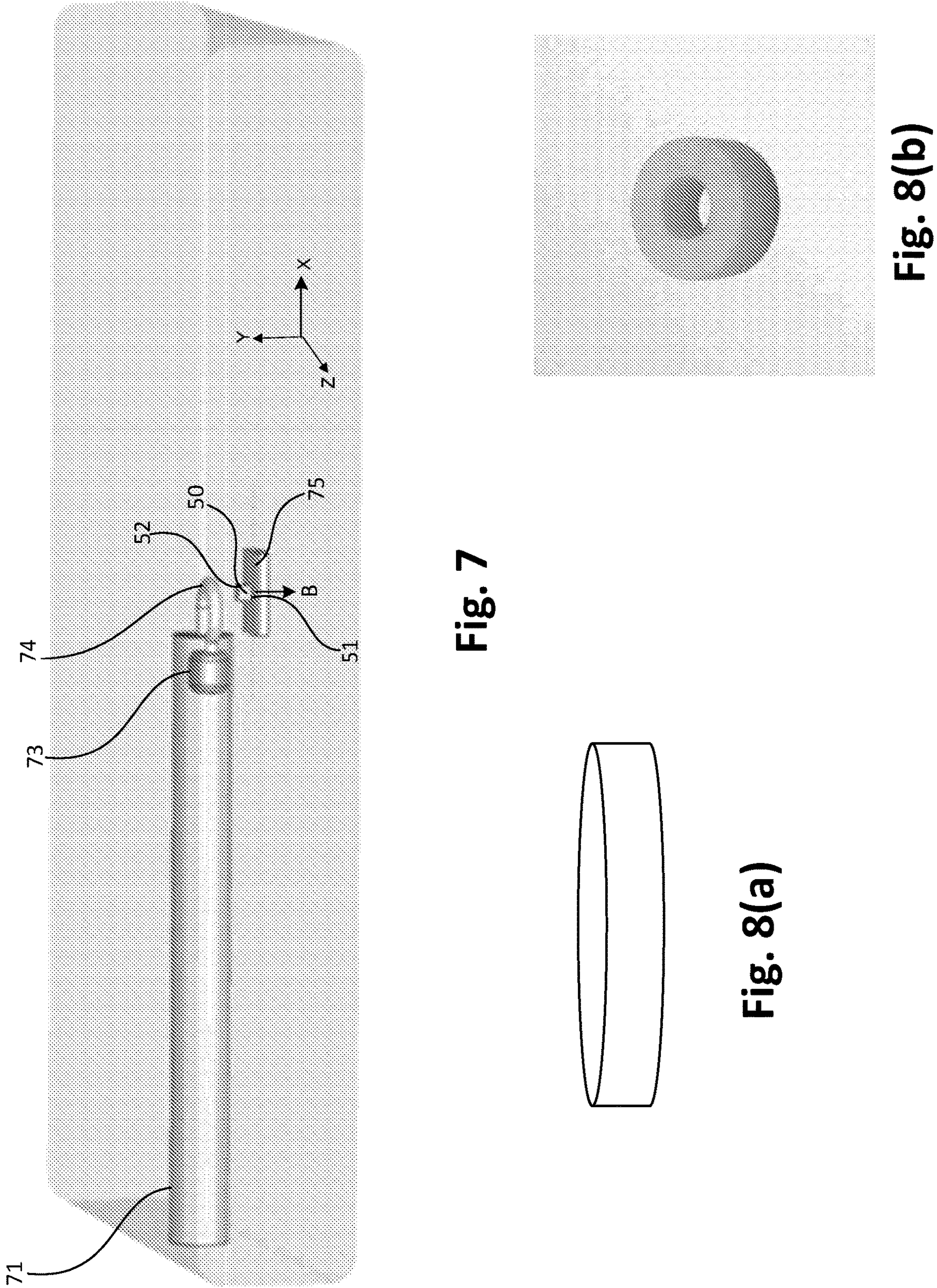
FIG. 7 illustrates an architecture for a scalable donor-based quantum computer that employs global control of qubits using a uniform magnetic field generated by a dielectric resonator, in accordance with an exemplary embodiment of the present disclosure.
FIGS. 8*a* and 8*b* show examples of alternative shapes of the dielectric resonator.

FIG. 7 illustrates an arrangement 70 for globally controlling qubits on a quantum computing chip/processor. As shown in this figure, the arrangement includes a quantum chip/processor 75, a dielectric resonator 50, and a coupler 74. The dielectric resonator 50 in this arrangement is placed over the quantum chip 75 in such a manner that one or more qubits of the quantum chip/processor are underneath the surface 51 of the dielectric resonator 50. The coupler 74 is positioned above the dielectric resonator 50 to excite the resonator. In one embodiment, the coupler 74 is configured to excite the resonator in the $TE_{11\delta}$ mode and the resonator 50 is positioned above the quantum chip with a small gap (less than the height of the dielectric resonator) between the bottom of the resonator 50 and the quantum dot qubit chip 75.

In this embodiment, the coupler 74 is a coaxial cable that provides an input MW signal to the dielectric resonator 50. In alternative embodiments, the MW input signal may be provided by a coupler of a different shape. In yet other embodiments, the MW input signal may be provided by some means. For example, using a printed circuit board with a lithographically-defined coupler or coupling through a waveguide and iris.

When the MW input signal is provided to the resonator 50, the electric E and magnetic B fields are generated in the resonator. As described above, the electric field component E is tightly confined within the resonator 50 whereas the magnetic field component B is directed perpendicular to the surfaces 51 and 52 of the resonator 50. Therefore, the one or more qubits located on the chip/processor 75 and facing the surface 51 interact with the magnetic field component B. This magnetic field acts as a global field to control the one or more qubits on the chip 75.

In an embodiment, a single qubit is controlled by the global magnetic field B produced by the dielectric resonator 50. In an alternative embodiment, multiple qubits (hundreds, thousands or millions) can be simultaneously controlled by the global magnetic field B produced by the dielectric resonator 50.

All the components of the system 70 can be accommodated inside a custom device enclosure 71, as shown in FIG. 7. In a further embodiment, a printed circuit board may be utilised.

In an alternative embodiment, the qubits may be facing the surface 52 of the dielectric resonator 50 if the quantum chip/processor 75 is situated above the dielectric resonator 50.

Although the above embodiments describe a cuboid shaped resonator 50 (see FIGS. 5-7 and 9), the invention is not limited to this particular shape of the resonator and alternative resonator shapes may also be adopted to realise the method and systems described herein. For example, the resonator may be square shaped, disk shaped (see disc shaped resonator 80 in FIG. 8*a*), cylindrical shaped, annulus shaped (see annulus shaped resonator 82 in FIG. 8*b*), square annulus shaped or rectangular annulus shaped, etc.

For annulus shaped geometries of the resonator as shown in FIG. 8*b*, the quantum chip (not shown in this diagram)

may be held inside the central cavity 83 or just below or above the cavity 83. The benefit of this type of geometry is that it potentially allows access to higher magnetic field strengths (as the magnetic field in this geometry peaks in the centre of the resonator 82).

In some embodiments of the present disclosure, for a given resonator (which has a dielectric constant of the order of a few thousands) each dimension (e.g. length, height, width, thickness or diameter) may be in the range of 100 micro-meters to 10 milli-meters. For a given dielectric constant, the operating frequency of the resonator depends on its volume. Accordingly, the dimensions of the resonator can be adjusted against one-another to achieve a certain volume and therefore a certain operating frequency. For example, a cuboid shaped potassium tantalate resonator can be manufactured with a volume of 0.5 mm×1 mm×1 mm. Such a resonator gives a resonant frequency of approximately 4.5 GHz (with the dielectric constant of potassium tantalate being 4300 at mK temperatures). The height of this resonator can be reduced by a factor of 4 and the length and width can be increased by a factor of 2 each (i.e. 0.125 mm×2 mm×2 mm) to obtain the same volume and a similar resonant frequency.

In some embodiments of the present disclosure, working distance between the resonator and the chip is in the range of 50 micro-meters to 5 milli-meters. The working distance between the resonator and the quantum chip is set by the resonator mode size, which in turn is limited by the dimensions of the resonator. Essentially, the separation between the resonator and the quantum chip is less than the height of the resonator.

Figure 9:
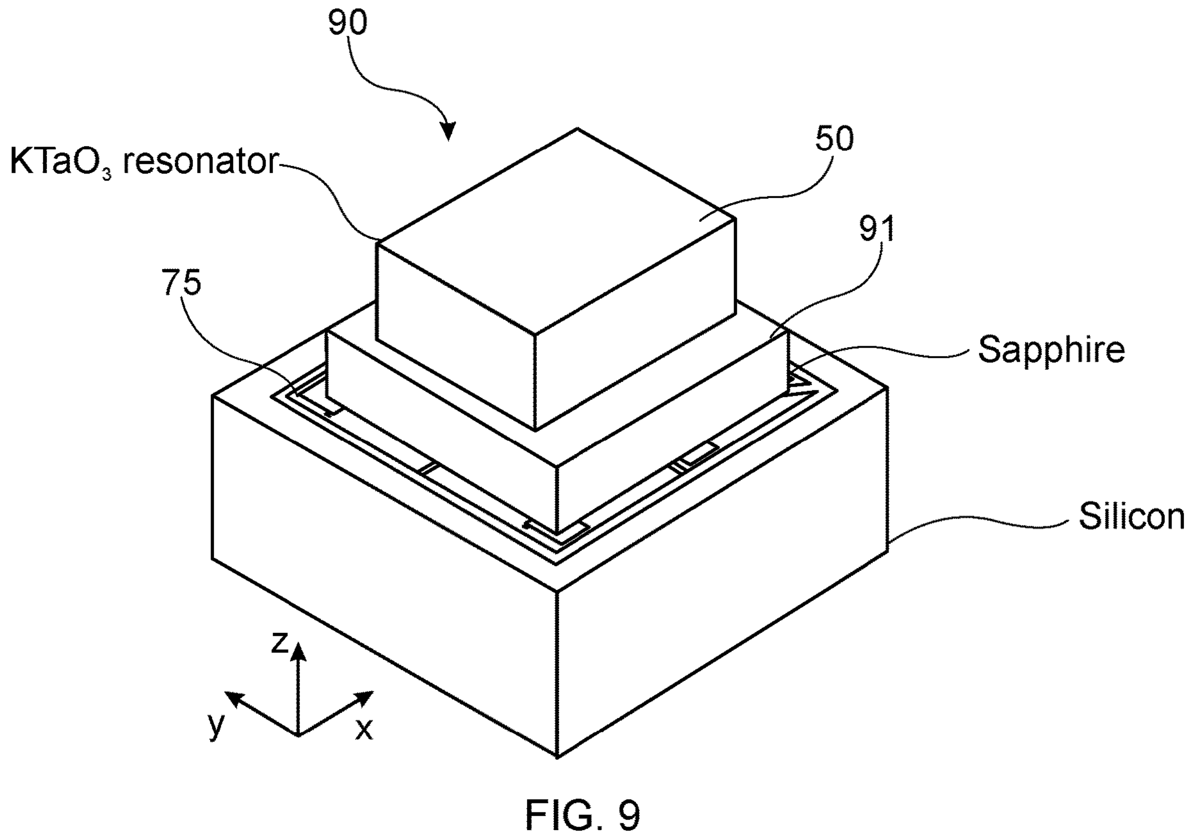
FIG. 9 illustrates an architecture for a scalable donor-based quantum computer that employs global control of qubits using a uniform magnetic field generated by a dielectric resonator, in accordance with another embodiment of the present disclosure.

In one embodiment, a low microwave loss tangent material such as a sapphire spacer or plate may be placed in the gap/separation between the quantum chip/processor 75 and the dielectric resonator 50. This arrangement 90 is depicted in FIG. 9, where the resonator 50 is spaced from the quantum processor chip 75 by a sapphire plate 92. In alternate embodiments, the dielectric resonator 50 can be suspended above or below the quantum chip/processor 75 with vacuum between the two surfaces. The sapphire spacer or vacuum space between the quantum processor and the dielectric resonator helps reduce losses and helps shield the quantum chip/processor 75 from stray electric fields.

In some embodiments of the present disclosure, the operating frequency of the resonator is preferably between 1 GHz to 100 GHz. Electron spin relaxation rates can become sizable (relative to the electron or nuclear spin coherence times) above 100 GHz. Further, microwave engineering at frequencies above 100 GHz becomes challenging and expensive.

Although the aforementioned methods and systems of the present disclosure describe global control for electron spins using a dielectric resonator, these techniques can also be implemented to control nuclear spins. In that case, the dielectric resonator frequencies can be in the range of 1.0 MHz to 1.0 GHz and the resonator sizes can scale accordingly using the equation $\omega \propto 1/(\varepsilon_r^{1/2} V^{1/3})$).

In some embodiments of the present disclosure, input power of the MW signal is less than 100 μW when the working temperature is in milli-Kelvin range. At working temperatures within 1.5 Kelvin-4.0 Kelvin, the input power is less than 1.0 W.

In some embodiments of the present disclosure, conversion factor C of the resonator may be in the range of 0.1-10.0 mT/√(mW) when the working temperature is in milli-Kelvin range. At working temperatures within 1.5 Kelvin-4.0 Kelvin, the higher conversion factors can also work.

In some embodiments of the present disclosure, the strength of the AC magnetic field provided by the dielectric resonator may be in the range of 0.01 mT to 100.0 mT.

Experimental Results

This section presents experimental results achieved by using the dielectric resonator 50 suspended above a quantum chip 75 formed of one or more spin-based qubits with an intervening sapphire spacer having a 200 micron width (e.g., as shown in the setup in FIG. 9).

Figure 10:
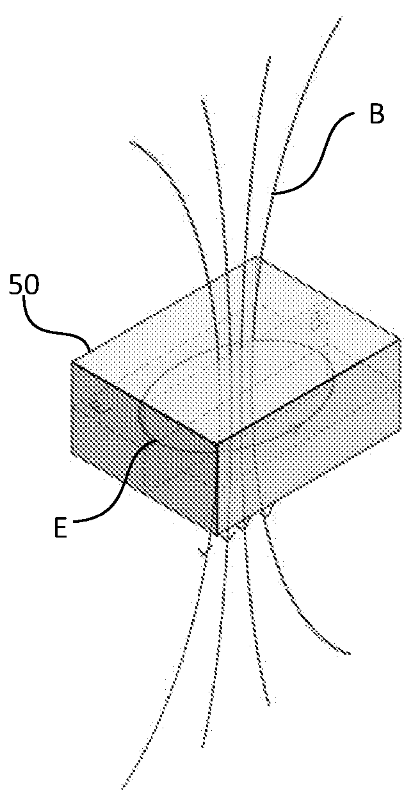
FIG. 10 illustrates a resonator according to some embodiments of the present disclosure with electric and magnetic field lines.

In the experimental setup, the coupler 74 excites the resonator 50 in the $TE_{11\delta}$ mode. In particular, the coupler 74 provides an input microwave signal to the dielectric resonator 50. When the microwave input signal is provided to the resonator 50, electric E and magnetic B fields are generated in the resonator 50 as shown in FIG. 10. As seen in FIG. 10, the electric field component E is tightly confined within the resonator 50 whereas the magnetic field component B is directed perpendicular to the surfaces 51 and 52 of the resonator 50.

Figure 11A:
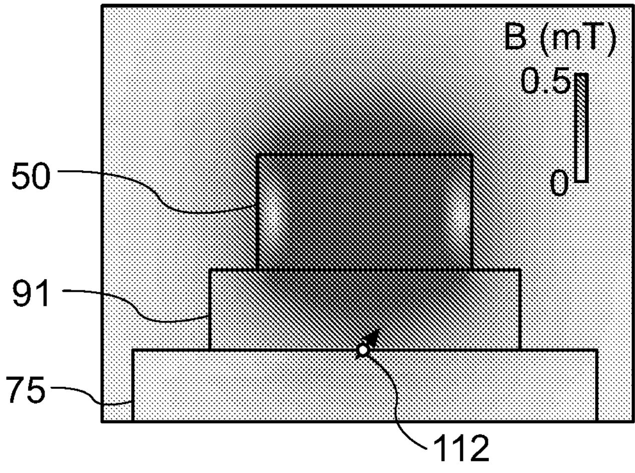
FIG. 11A illustrates finite-element simulation of the magnetic field magnitude of the fundamental mode of the resonator excited with a microwave signal power of 100 μW.
Figure 11B:
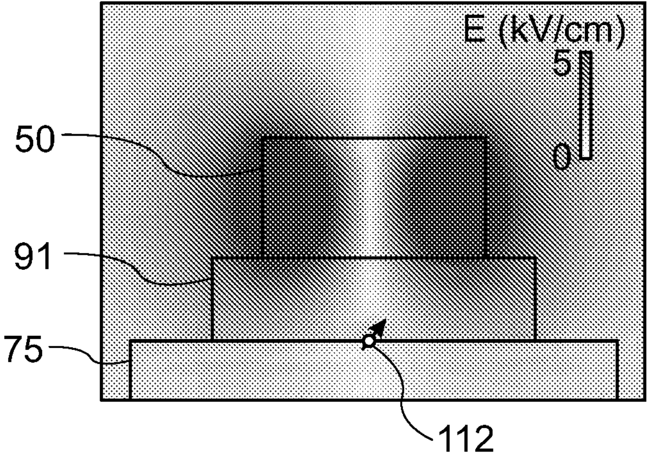
FIG. 11B illustrates finite-element simulation of the electric field magnitude of the fundamental mode of the resonator excited with a microwave signal power of 100 μW.

FIGS. 11A and 11B show finite-element simulations of the electric and magnetic field magnitudes, respectively, in the device stack (of FIG. 9), when the fundamental mode of the resonator 50 is excited with a microwave input signal. The input power used in this experiment is 100 microWatts. However, it will be appreciated that similar magnetic field and electric field patterns are generated for other input power values as well, where magnetic field conversion is provided by (mT/√W) and electric field conversion is provided by (kV/cm/√W). The darker areas in FIGS. 11A and 11B represent areas with high magnetic and electrical fields, respectively and the lighter areas in FIGS. 11A and 11B represent areas with low to zero magnetic and electrical fields, respectively. As seen in FIG. 11B, when an input power signal is applied to the resonator 50, the electric field experienced by a qubit 112 on the surface of the quantum processor 75, is close to zero, whereas (as seen in FIG. 11A) a magnetic field close to 0.5 mT is experienced by the qubit 112.

Figure 12:
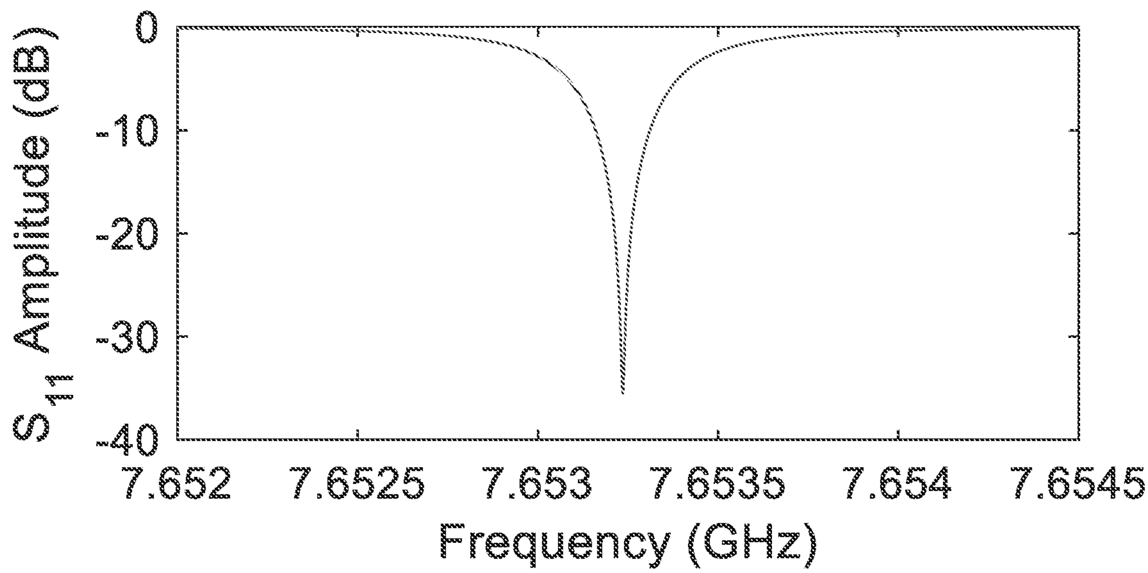
FIG. 12 is a plot illustrating the microwave reflection S-parameter of the resonator near the fundamental mode of the dielectric resonator, as probed from a coaxial loop coupler.

FIG. 12 is a chart showing the reflection parameter ($S_{11}$) of the resonator versus frequency near its fundamental mode as probed from the coaxial loop coupler 74. The reflection parameter, $S_{11}$, represents the amount of power reflected from the resonator, and hence is known as the reflection coefficient. If $S_{11}$=0 dB, then all the power is reflected from the resonator and nothing is absorbed. If $S_{11}$<0 dB, then some of the input power is absorbed by the resonator and produces the electric and magnetic fields.

As seen in FIG. 12, the $S_{11}$ amplitude is close to −40 dB at a frequency between 7.653 and 7.6535 GHz. In case critical coupling is achieved between the resonator 50 and the coupler 74, the S11 amplitude can theoretically dip to −∞. At the critical coupling frequency, the most efficient power transfer to the resonator occurs.

From this plot, it becomes apparent that the resonator 50 mode is excited and generates the E and B field profiles depicted in FIGS. 11*a* and 11*b* best between 7.653 and 7.6535 GHz and that when operated in this frequency range can result in achieving critical coupling with the coupler 74.

Further, although any spin-based quantum processor chip may be utilized with the resonator 50, the experiments discussed in this section are performed on singlet-triplet qubits. In singlet-triplet qubits, two quantum dots, each with one or more electrons, are formed side-by-side and tuned so that they are tunnel coupled. Information can be stored in the relative spin of the two electrons, further reducing coupling of the qubit to its environment. Of the four possible relative spin states of the electrons (S, T0, T+, and T−), information is generally stored in the singlet state S and the triplet state T0 (the so-called 'logical subspace'). This choice is generally motivated by two advantages. First, these two qubit states remain unaffected by changes in magnetic field (they are both m=0), which further decouples them from the environment. Second, due to the Pauli Exclusion principle, while in the singlet state one electron has an orbital wavefunction hybridized between the two dots, in the triplet states both electrons are confined to separate dots. Therefore, by tuning the relative chemical potentials of the two dots, the charge distribution of the singlet state and the relative energy of the singlet and triplet states can be distributed.

Figure 13A:
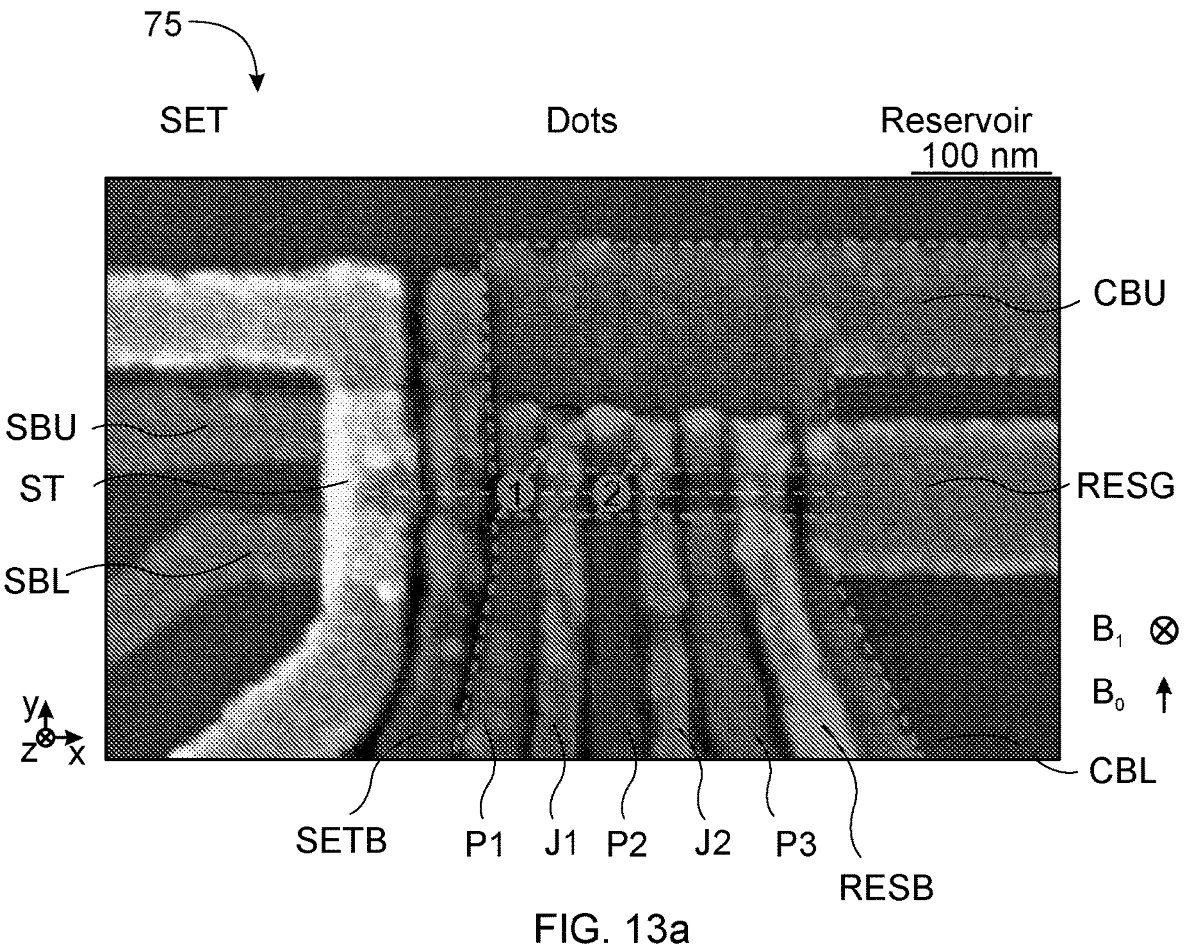
FIG. 13A is a scanning electron micrograph (SEM) of the quantum processor chip used in the experiments.
Figure 13B:
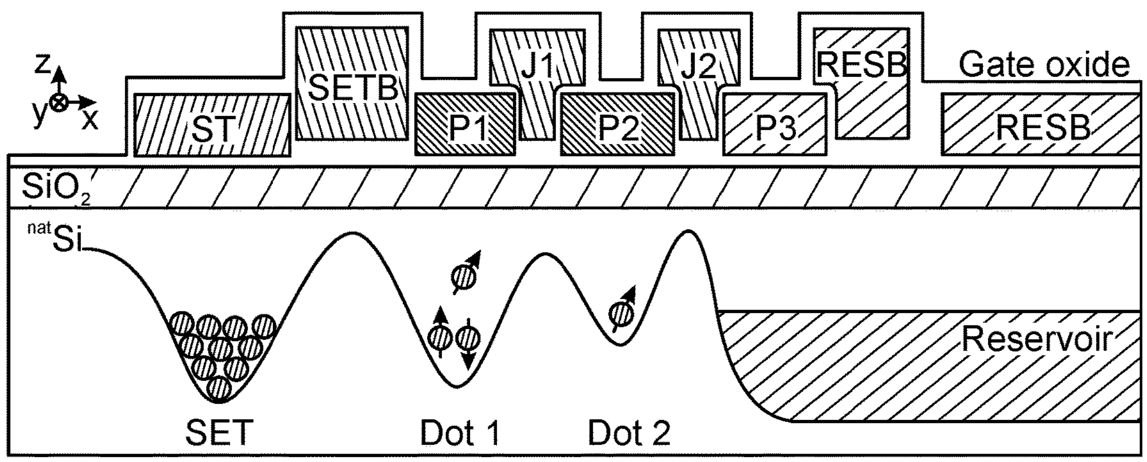
FIG. 13B is a cross-section through the middle of the quantum processor chip of FIG. 13A and conduction band profile of the device.

FIG. 13A illustrates an example quantum processor chip 75 including a double quantum dot. In particular, FIG. 13A is a scanning electron microscope (SEM) image 130 of the quantum processor chip 75. FIG. 13B depicts a cross-section 132 of the quantum processor chip of FIG. 10A. The cross-section 132 is taken through the middle of the device (marked with a dashed line in FIG. 13A). The cross section 132 indicates 3D structure of the quantum processor chip 75 and its conduction band profile.

As seen in FIGS. 13A and 13B, the quantum processor chip 75 includes quantum dots (Dot 1 and Dot 2), a single electron transistor (SET) sensor to sense or read the state of the quantum dots D1 and D2, and a reservoir (RESG) to load electrons in the double-quantum dots D1, D2 to form singlet-triplet qubits. Further, gate electrodes P1 and P2 are located on top of the quantum dots D1 and D2.

Figure 14A:
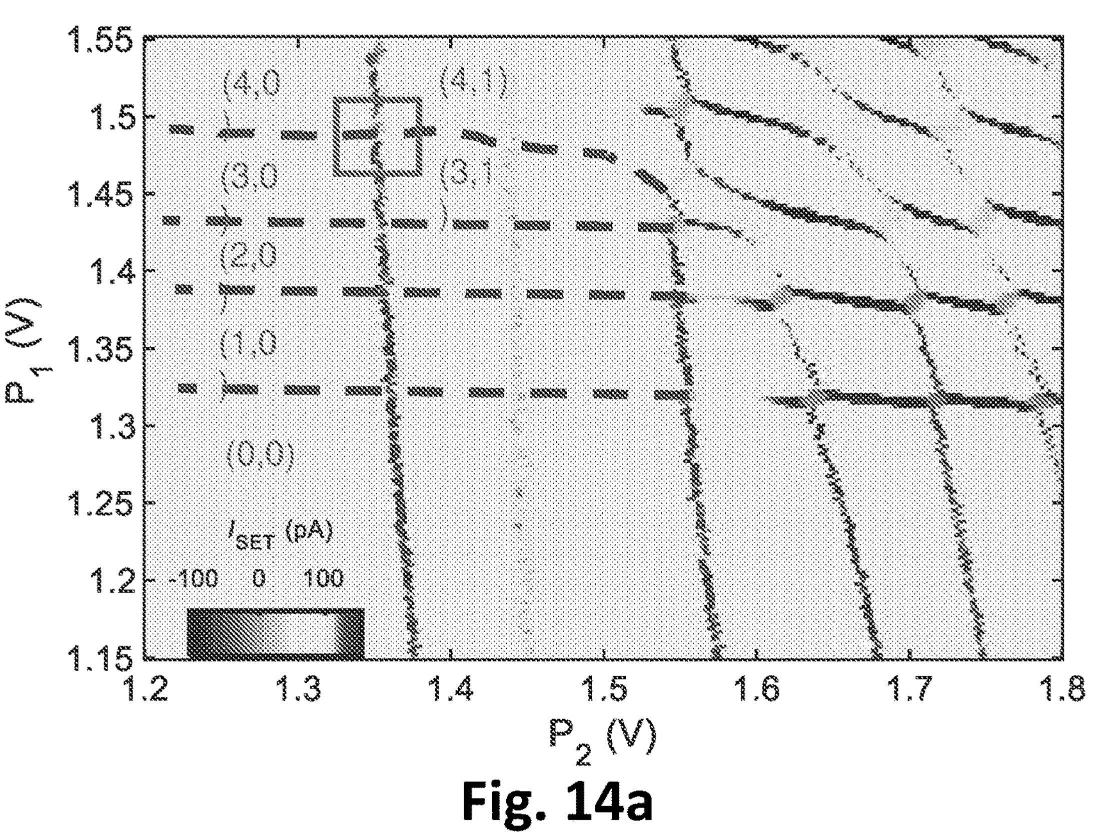
FIG. 14A is a stability diagram of the spin qubit in the device of FIG. 13A.

FIG. 14A shows a two-dimensional stability map 140 of the double quantum dot D1, D2 obtained by scanning the gate electrodes (P1, P2) above each dot D1 and D2 and monitoring the current $I_{SET}$ through the SET sensor as electrons jump into and out of the two quantum dots D1 and D2. This map 140 shows the charge states or occupancy of each dot in relation to a bias applied through a gate electrode. In particular, the horizontal and vertical lines show when electrons jump in and out of the quantum dots D1, D2. The section marked by reference numeral 142 shows the singlet-triplet state with 3 electrons in dot 2, and 1 electron in dot 1. The numbers in parentheses in the stability map 140 are the charge occupancies of the double dot system Dot 1, Dot 2: (N1,N2).

Figure 14B:
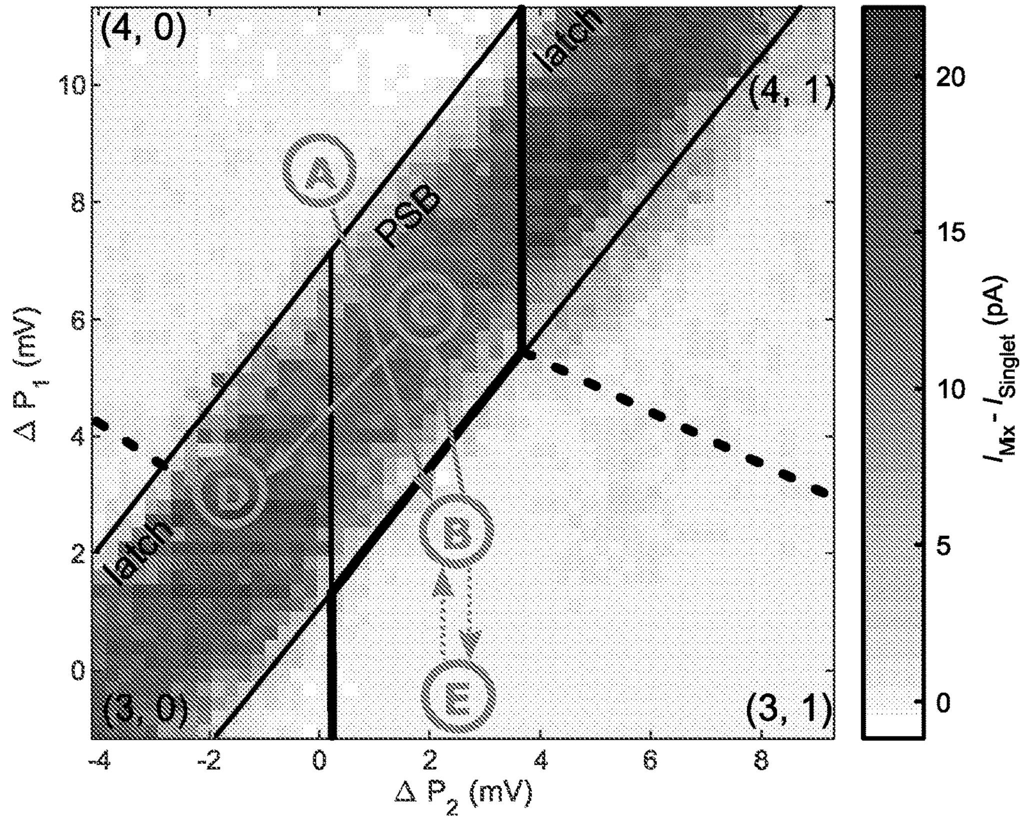
FIG. 14B shows a readout pulse sequence overlayed on a portion of the stability diagram shown in FIG. 14A.

FIG. 14B shows a readout pulse sequence overlayed on a plot 145 of the difference in SET current between mixed (i.e., mixed spin singlet and triplet) and singlet spin state preparation, as a function of the voltages on gates P1 and P2. The spin singlet state is prepared by pulsing from (4,1) to (4,0) occupancy and the mixed state is prepared by pulsing from (3,0) to (3,1) occupancy. The pulse sequence A to B prepares a separated double quantum dot with electrons in a mixed spin state. Readout is performed in steps B to D. B to C attempts to push the electron from dot 2 to dot 1. If the electron in dot 2 forms a singlet with the electron in dot 1, tunneling will occur. However, if a triplet state is formed, tunneling will be blocked. C to D increases readout visibility via the enhanced latching mechanism. And E represents the level used when performing ESR. The solid lines in the plot indicate transitions with high tunnel rates, the dashed lines in the plot indicate transitions with low tunnel rates, and the thin lines outline the Pauli spin blockade (PSB) and latch regions.

Figure 15A:
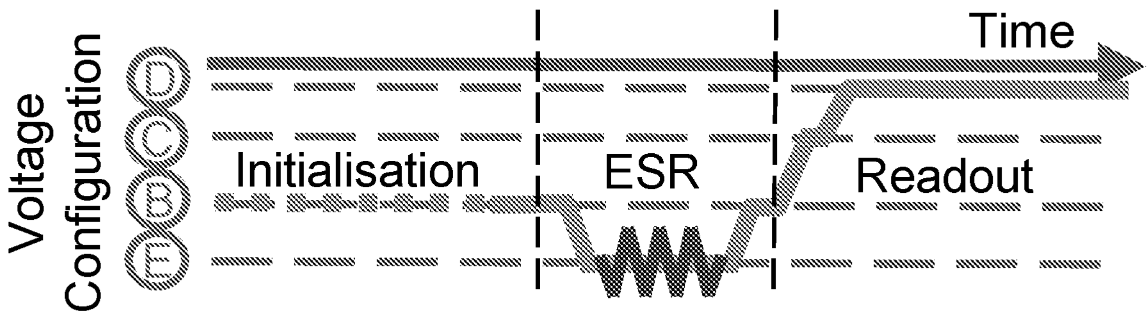
FIG. 15A shows a pulsing scheme for electron spin resonance measurements using the resonator of the present disclosure.

FIG. 15A shows a pulsing scheme (A-D as shown in FIG. 14B) for electron spin resonance measurements using the resonator 50. The double quantum dot D1, D2 is initialized in a spin triplet state at A. Microwave power is then applied to the dielectric resonator 50 at B, generating an AC magnetic field B, which rotates the spins of the electrons in the quantum dots D1, D2. Spin resonance lifts the spin blockade and results in a decrease of triplet probability during readout.

Figure 15B:
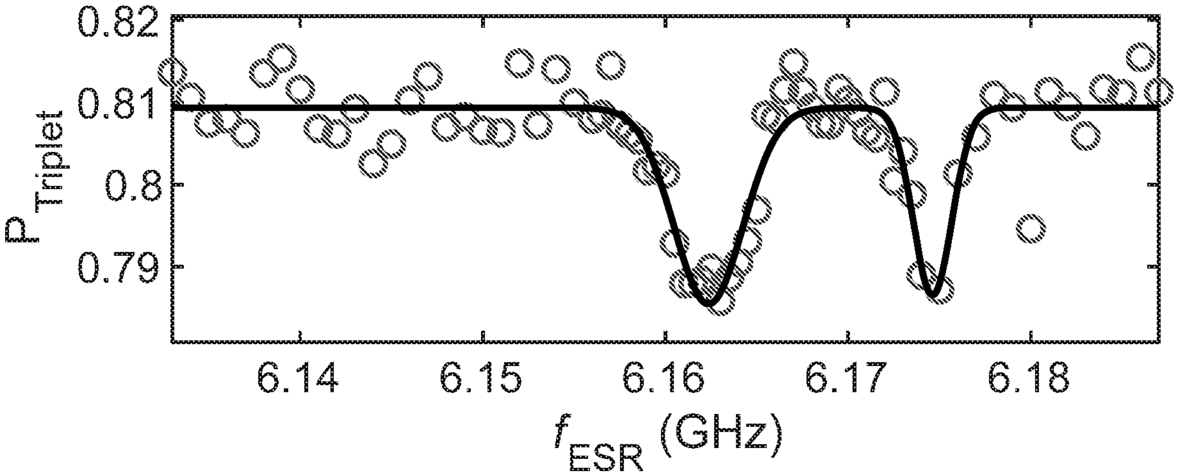
FIG. 15B is a chart showing triplet probability as a function of applied microwave frequency

FIG. 15B is a plot showing triplet state probability of the double quantum dot as a function of applied microwave frequency at a DC magnetic field of 227.48 mT. The plot shows two electron spin resonance (ESR) peaks. This plot demonstrates proof-of-principle off-chip control of the quantum dot spins through the dielectric resonator 50.

Figure 15C:
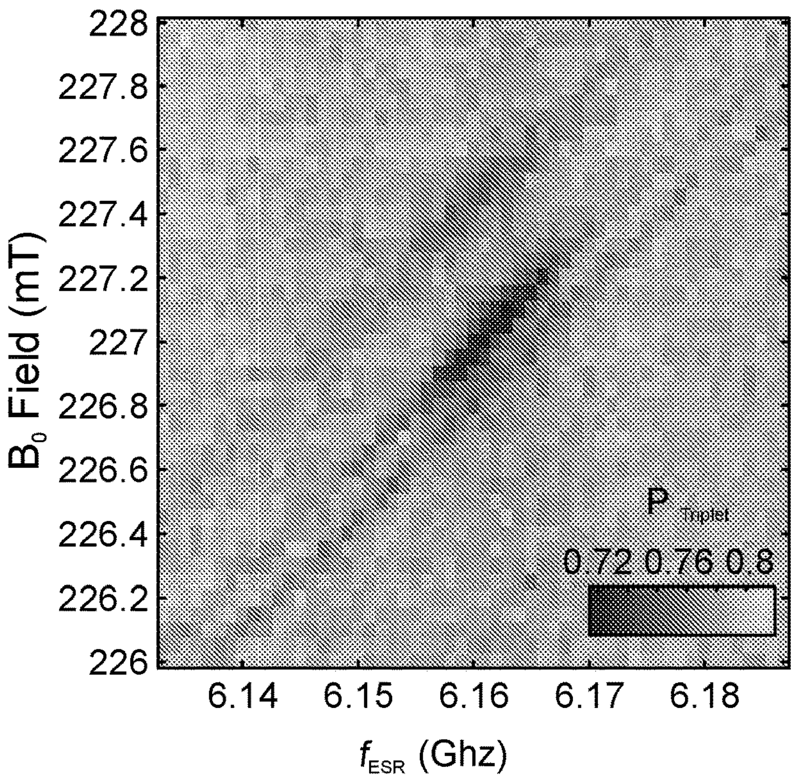
FIG. 15C shows triplet probability as a function of the applied microwave frequency and DC magnetic field.

FIG. 15C shows triplet probability as a function of the applied microwave frequency and DC magnetic field. As seen in this figure, the triplet probability dips at the resonant frequency of the resonator 50—demonstrating that the ESR peaks shift with magnetic field as expected.

Figure 15D:
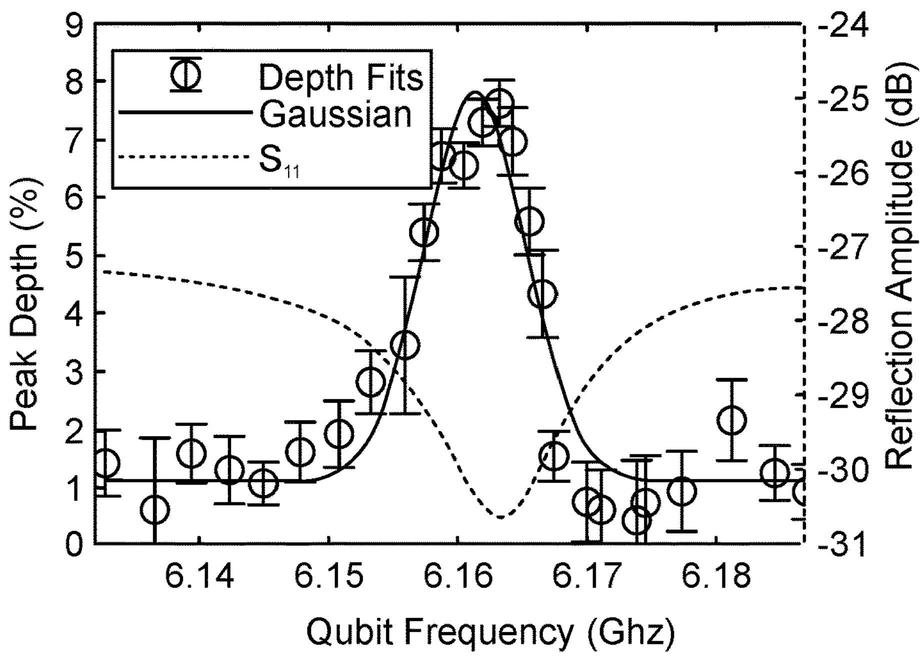
FIG. 15D is a plot taken along the diagonal of FIG. 15C showing triplet probability and reflection parameter of the resonator as a function of microwave drive frequency, demonstrating enhancement of ESR at the dielectric resonator frequency.

FIG. 15D is a slice taken along the diagonal of FIG. 15C and shows triplet probability as a function of microwave drive frequency, measured whilst stepping the magnetic field such that the spin-triplet energy splitting equals the drive frequency. When the microwave frequency matches that of the dielectric resonator, the triplet probability decreases, and an enhancement in the spin resonance signal is observed.

It will be understood that the invention disclosed and defined in this specification extends to all alternative combinations of two or more of the individual features mentioned or evident from the text or drawings. All of these different combinations constitute various alternative aspects of the invention.

The invention claimed is:

1. A system for controlling one or more qubits in a quantum processor, the system comprising:
- a quantum processor comprising one or more spin-based qubits; and
- a dielectric resonator positioned in proximity to the quantum processor, the dielectric resonator providing a magnetic field, and
- the quantum processor being positioned in a portion of the magnetic field provided by the dielectric resonator such that the portion of the magnetic field controls the spin transitions of the one or more spin-based qubits of the quantum processor.

2. The system of claim 1, wherein the multiple spin-based qubits of the quantum processor are operated and controlled by the portion of the magnetic field provided by the dielectric resonator at a cryogenic temperature.

3. The system of claim 2, wherein the cryogenic temperature is 1 milli-Kelvin to 4 Kelvin.

4. The system of claim 1, wherein the dielectric resonator is made of a dielectric material having a dielectric constant that increases at a cryogenic temperature relative to at room temperature.

5. The system of claim 4, wherein the dielectric constant of the resonator is in a range of 1000 to 40,000 at the cryogenic temperature.

6. The system of claim 1, wherein the portion of the magnetic field controlling the one or more spin-based qubits is a uniform AC magnetic field.

7. The system of claim 1, wherein the portion of the magnetic field acts as a global magnetic field for simultaneously controlling a plurality of spin-based qubits of the quantum processor.

8. The system of claim 1, wherein the dielectric resonator produces an electric field spatially separated from the magnetic field.

9. The system of claim 8, wherein the electric field is substantially confined inside the dielectric resonator.

10. The system of claim 9, wherein the dielectric resonator is made of potassium tantalate (KTaC>3) or strontium titanate (SrTiC>3).

11. The system of claim 8, wherein the electric field circulates within the resonator.

12. The system of claim 1, wherein the magnetic field of the dielectric resonator is perpendicular to a surface of the resonator and is directed outwardly of a surface of the dielectric resonator.

13. The system of claim 1, wherein the dielectric resonator is made of a material from a class of compounds having a perovskite structure ($^{X!i}A^{2+V!}B^{4+}X^{2-}3$).

14. The system of claim 1, wherein the dielectric resonator provides a resonant mode volume of approximately $5\times10^{7}$ $m^{3}$.

15. The system of claim 1, wherein the quantum processor is a solid-state semiconducting or superconducting quantum processor.

16. The system of claim 1, wherein the dielectric resonator is in the form of a solid block of a dielectric material and the quantum processor is placed either above or below the dielectric resonator such that the one or more spin-based qubits of the quantum processor face towards the dielectric resonator to interact with the portion of the magnetic field provided by the dielectric resonator.

17. The system of claim 1, wherein the system further comprises a tuneable coupling element to provide a microwave input signal to the dielectric resonator for generating the magnetic field.

18. The system of claim 1, wherein the resonator has a quality factor Q having a value greater than 100 at cryogenic temperatures.

19. The system of claim 1, wherein a frequency of the magnetic field produced by the resonator is in radio frequency range from 1.0 MHz to 1.0 GHz for controlling nuclear spins.

20. The system of claim 1, wherein a frequency of the magnetic field produced by the resonator is in microwave frequency range which is in a range of 1.0 GHz to 100.0 GHz for controlling electron spins.

21. A method comprising:

controlling one or more spin-based qubits in a quantum processor using a system, wherein the system including:

the quantum processor comprising the one or more spin-based qubits; and a dielectric resonator positioned in proximity to the quantum processor, the dielectric resonator providing a magnetic field, and the quantum processor being positioned in a portion of the magnetic field provided by the dielectric resonator such that the portion of the magnetic field controls the spin transitions of the one or more spin-based qubits of the quantum processor.

* * * * *